Figure 1:
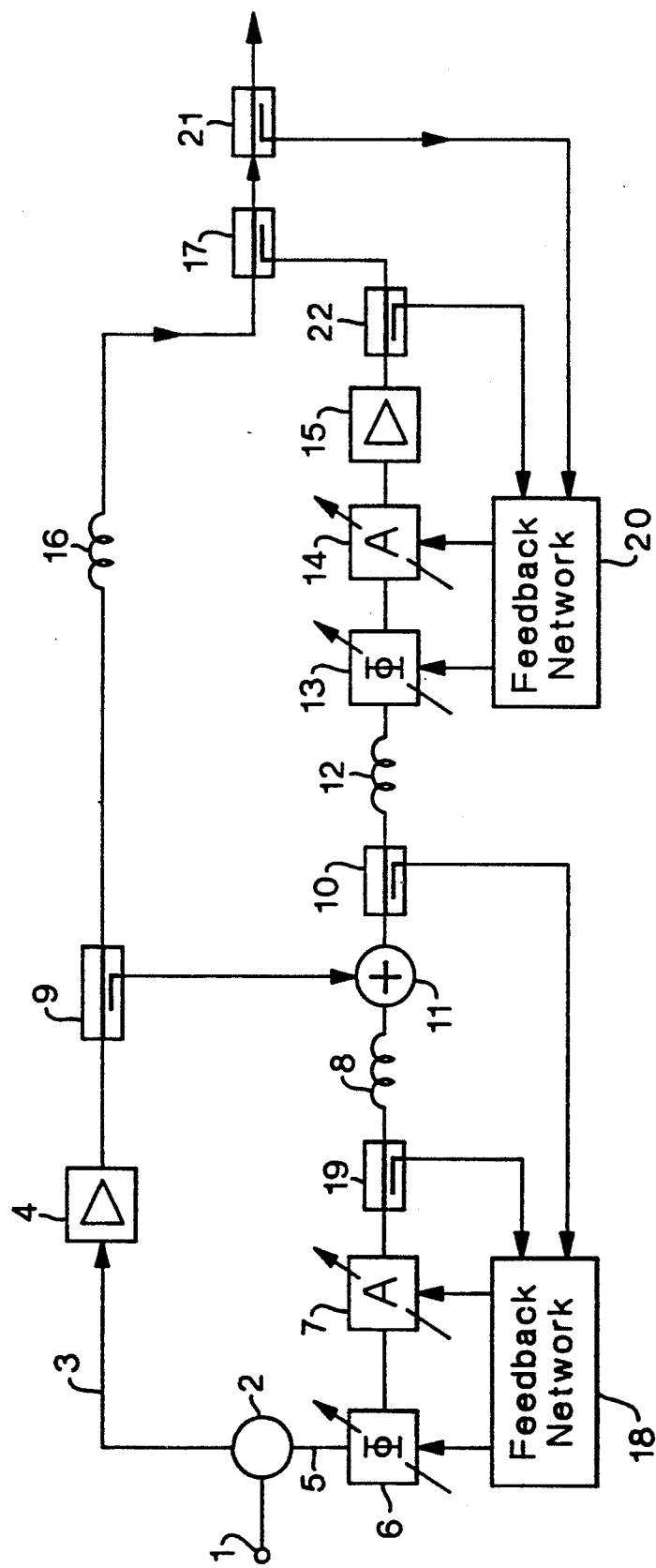

United States Patent [19]
Kenington et al.

[11] Patent Number: 5,157,345
[45] Date of Patent: Oct. 20, 1992

[54] APPARATUS AND METHOD FOR REDUCING DISTORTION IN AMPLIFICATION

[75] Inventors: Peter B. Kenington, Winterbourne; Mark A. Beach, Frampton Cotterell; Andrew Bateman, Bath; Joseph P. McGeehan, Corsham, all of England

[73] Assignee: National Research Development Corporation, London, England

[21] Appl. No.: 689,346

[22] Filed: Apr. 24, 1991

[30] Foreign Application Priority Data

Apr. 25, 1990 [GB] United Kingdom ............... 9009295

[51] Int. Cl.⁵ ............................................. H03F 1/26
[52] U.S. Cl. ..................................... 330/149; 330/151
[58] Field of Search ................. 330/149, 151; 328/163

[56] References Cited

U.S. PATENT DOCUMENTS

| | | | |
|---|---|---|---|
| 3,886,470 | 5/1975 | O'Neil et al. | 330/149 |
| 3,922,617 | 11/1975 | Denniston et al. | 330/149 |
| 4,146,844 | 3/1979 | Quinn | 330/149 |
| 4,348,642 | 9/1982 | Harrington | 330/149 |
| 4,389,618 | 6/1983 | Bauman | 330/149 |
| 4,394,624 | 7/1983 | Bauman | 330/151 |
| 4,462,001 | 7/1984 | Girard | 330/149 |
| 4,560,945 | 12/1985 | Olver | 330/149 |
| 4,580,105 | 4/1986 | Myer | 330/149 |
| 4,879,519 | 11/1989 | Myer | 330/151 X |
| 4,885,551 | 12/1989 | Myer | 330/52 |

FOREIGN PATENT DOCUMENTS

| | | |
|---|---|---|
| 2019104 | 4/1970 | Fed. Rep. of Germany . |
| 198809 | 8/1989 | Japan ............... 330/149 |
| 8604469 | 7/1986 | PCT Int'l Appl. . |
| 1246209 | 9/1971 | United Kingdom . |
| 2080062 | 1/1982 | United Kingdom . |
| 2107540 | 4/1983 | United Kingdom . |
| 2167256 | 5/1986 | United Kingdom . |
| 2238195 | 5/1991 | United Kingdom . |
| 2238196 | 5/1991 | United Kingdom . |
| 2238197 | 5/1991 | United Kingdom . |

OTHER PUBLICATIONS

P. D. Lubell et al., Linearizing Amplifiers for Multi-Signal Use (Microwaves, Apr. 1974) pp. 46-50.

*Primary Examiner*—James B. Mullins
*Attorney, Agent, or Firm*—Cushman, Darby & Cushman

[57] ABSTRACT

Broadband amplifiers which are intended to be linear suffer from distortion and although many techniques have been devised to overcome this problem significant improvements are required especially at frequencies above 100 MHz. An error signal is formed from the output of an amplifier by comparison in a subtractor with its input and the error signal is combined in a coupler with the amplifier output to reduce distortion. The present invention provides automatic amplitude and phase control of the signals forming the error signal by two groups of adjustment means, one group in a multi-channel input path and one group in the error signal path. These groups receive control signals from respective feedback networks which each process two of three input signals from: couplers before the subtractor, a coupler which passes the error signal and a coupler situated after the coupler which combines the amplifier output signal and the error signal. Preferably the two input signals used by a feedback network are used to form in-phase and quadrature signals using a 90° phase shifter and two mixers. These signals are each amplified and integrated to provide the control signals. The input signals from the feedback networks may be reduced in frequency and applied to a DSP which then provides the control signals.

26 Claims, 6 Drawing Sheets

APPARATUS AND METHOD FOR REDUCING DISTORTION IN AMPLIFICATION

The present invention relates to the reduction of distortion in amplifiers, and particularly to the use of a real-time feedback technique in a feedforward correction loop in order to reduce the distortion in high power broadband linear amplifiers.

All linear amplifiers distort the signals they are required to amplify, to some degree, and this is particularly undesirable when two or more independent channels are being amplified. Under these circumstances unwanted intermodulation products are generated which can cause interference and result in poor operation of the system in which they are based. For this reason these distortion products must be kept below certain pre-defined levels and a number of techniques have been suggested in order to perform this function.

Based on known audio amplifier theory, various feedback techniques have been developed in order to eliminate distortion. These have generally concentrated on the areas of signal feedback, operating at the final output frequency of the amplifier, and modulation feedback, which operates at the baseband input frequency of the whole transmitter. Both of these schemes suffer from two common problems, namely instability at high values of feedback loop gain and poor broadband performance. As a result these techniques have generally been restricted to narrow-band amplifiers operating on a single channel.

Predistortion techniques have been suggested in order to eliminate the instability problem inherent in feedback systems by adaptively altering the amplitude and phase weights of the predistortion signals, but these techniques do not operate in real-time. The updating process must be performed frequently enough to compensate for parameter drift in the amplifier, but infrequently enough to avoid instability. Such techniques usually have the drawback of requiring large amounts of memory in order to store the various predistortion parameters and a reasonable amount of processing power in order to update them.

Feedforward techniques overcome all of the problems mentioned above as they rely on creating a time delayed error signal, which when added to the linearly amplified signal cancels the intermodulation products. The degree of cancellation of these distortion products is critically dependent upon the accuracy of the gain and phase adjustment of the error signal. These signals must be continually adjusted in order to maintain the performance of the amplifier at the highest level. In U.S. Pat. No. 4,580,105 such adjustments are achieved by injecting a pilot signal which is extracted after passing through the amplifier and used to control the gain and phase of the error signal.

British Specification 2 107 540B describes a feedforward amplifier in which an error signal is obtained by comparing the amplifier output signal with its input signal to derive an error signal which is combined with the amplifier output signal. Two compensation circuits are used, one for the signals used in the comparison and one for the error signal. The amplitude and phase of the output of the compensation circuits are automatically controlled by means of two signals which control the gain of two parallel broad-band amplifiers in the compensation circuits. As a whole this parallel arrangement provides the required compensation. The arrangement is difficult to construct and operate because the two broad-band amplifiers must be very similar and the circuits deriving their control signals must be carefully controlled if useful compensation is to be obtained. This is difficult at any frequency but particularly difficult at frequencies above 100 MHz. The gain versus frequency characteristics of the two amplifiers must follow each other closely since any discrepancy will lead to cancellation of the unwanted error-signal components (or final output distortion) only being achieved at a single frequency or over a narrow bandwidth. The overall flatness of the frequency response (in both gain and phase) of the combined amplifiers must also be good, in the same way as the main error amplifier response must be flat, and this is an additional, and undesirable, system constraint. The above mentioned specification is referenced in British Specification 2 167 256A where it is cited as the only example given of phase and amplitude control. The suggestion that respective amplitude and phase control is provided appears to be in error. U.S. Pat. No. 4,885,551 describes an arrangement which also uses amplitude and phase compensation circuits and in which gain and phase control is provided by a programmed controller which alternately adjusts gain and phase. The arrangement described does not provide signals which are dependent on phase and gain separately so that the adjustments of gain and phase are not independent. Also by using successive signals phase and gain adjustments are relatively lengthy and not suitable for many applications.

According to a first aspect of the present invention there is provided apparatus for reducing the distortion produced by an amplifier, comprising error-signal generating means for connection to the input and output of an amplifier for deriving an error signal dependent on the output of the amplifier and input signals supplied to the amplifier from which it is required to provide undistorted output signals, correction means for cancelling the distortion in the amplifier output signals by using the error signal, the error-signal generating means comprising independently acting first and second adjustment means for automatically, respectively, adjusting the amplitude and phase of the error signal or the amplifier output signal, and/or signals used in generating the error signal, in response to respective first and second simultaneously derived control signals to give improved cancellation of the said distortion, and control means for generating the first and second control signals in dependence upon the said input signals or signals derived therefrom.

According to a second aspect of the present invention there is provided a method of reducing the distortion produced by an amplifier comprising the steps of deriving an error signal dependent on the output signals of the amplifier and input signals supplied to the amplifier from which it is required to provide undistorted output signals, cancelling the distortion produced by the amplifier using the error signal, automatically adjusting, independently, the amplitude and phase of the error signal or the amplifier output signal, and/or signals used in generating the error signal, in response to respective simultaneously derived first and second control signals to give substantially improved cancellation of the said distortion, and generating the, or each, control signal in dependence upon the said input signals or signals derived therefrom.

By providing independently acting adjustment for amplitude and phase control responsive to simultaneously derived control signals, the present invention helps to deal with the problems of temperature, ageing and speed of action mentioned above in connection with U.K. Patent Specifications 2 107 540B and 2 167 256A and U.S. Pat. No. 4,885.551, and allows fast adjustment suitable for broadband amplifiers operating, for example, above 100 MHz.

A number of real-time feedback control techniques are described in this specification which operate to optimise the gain and phase adjustments in both an error determining loop and an error cancellation loop of an amplifier employing feedforward distortion correction. The techniques described cover both narrowband and broadband correction utilising both single and multiple input channels and error determining loops.

Several different forms of control system are described which include energy minimisation and in-phase-quadrature (I-Q) zero-search techniques. The control systems described may be applied to both the error determining loop and the error cancellation loop.

Figure 2:
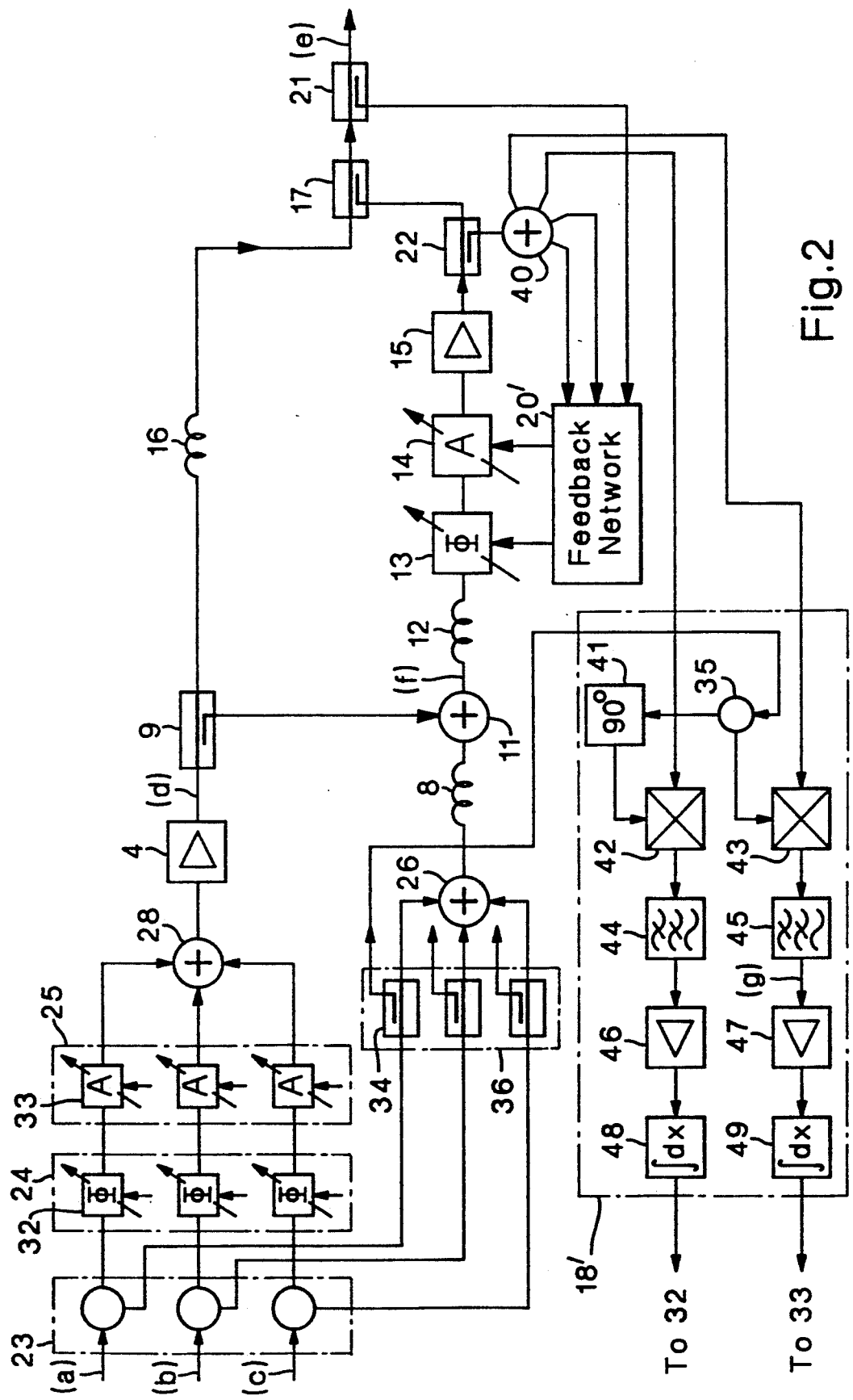
Figure 3:
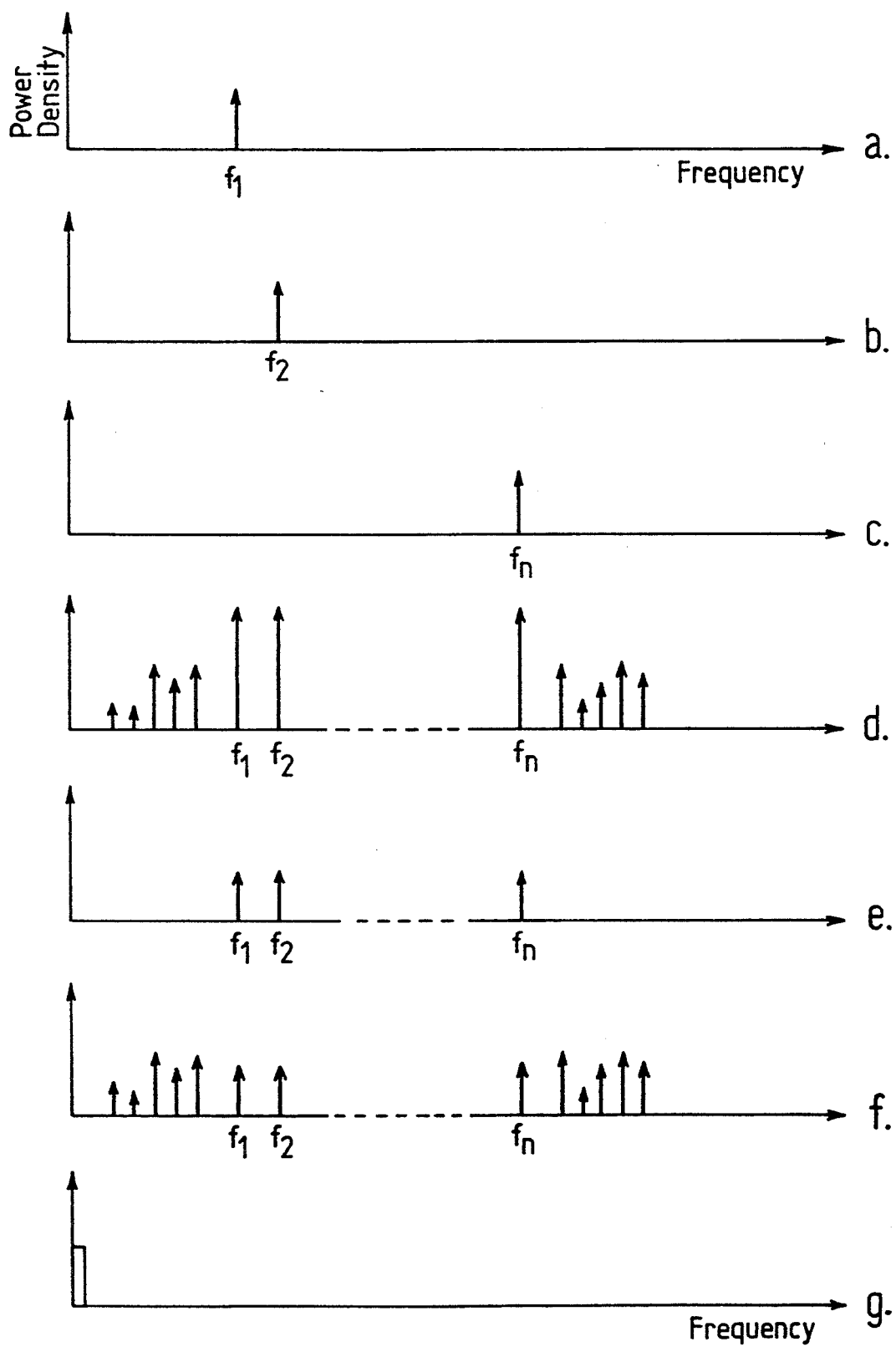
Figure 4:
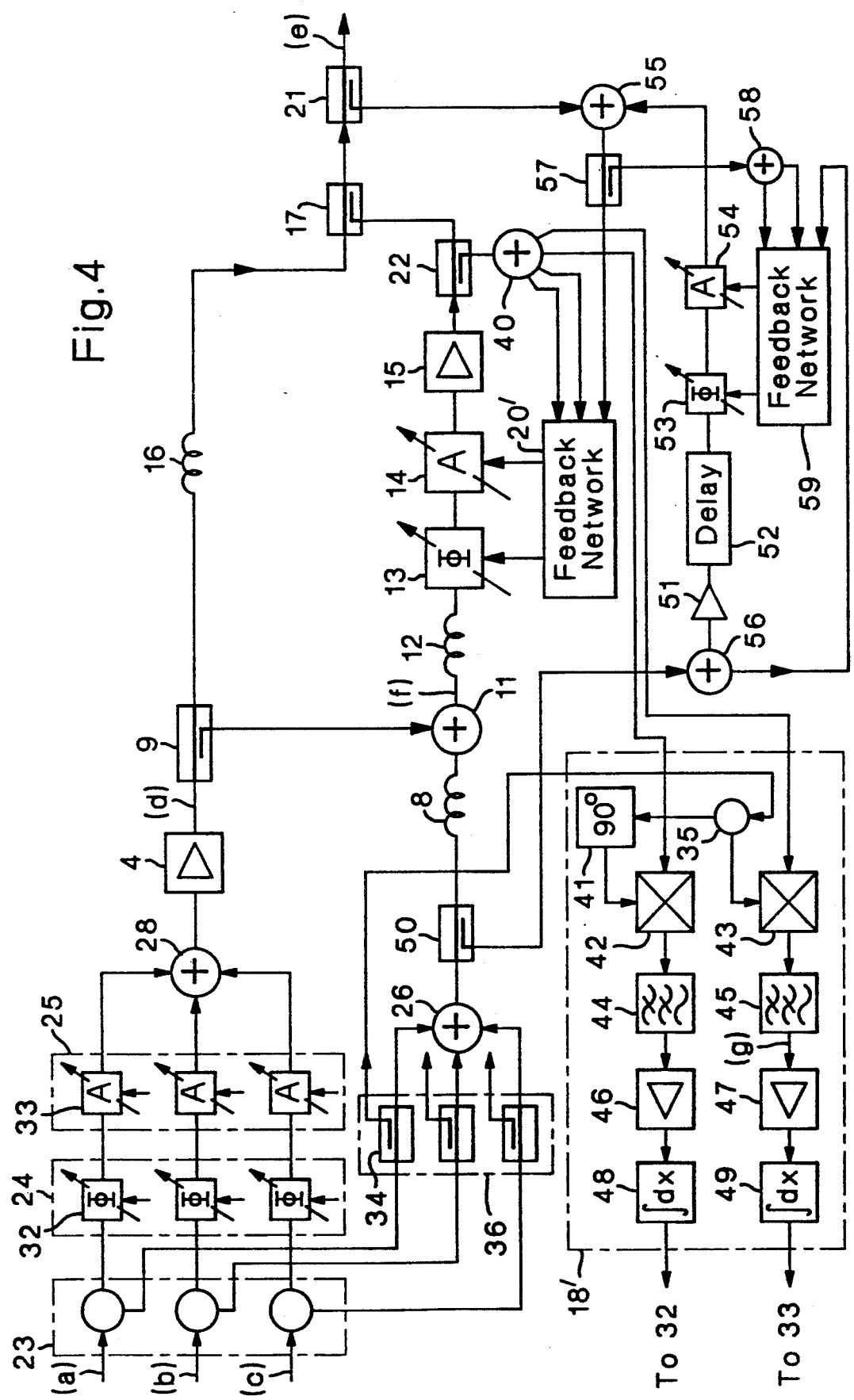
Figure 5:
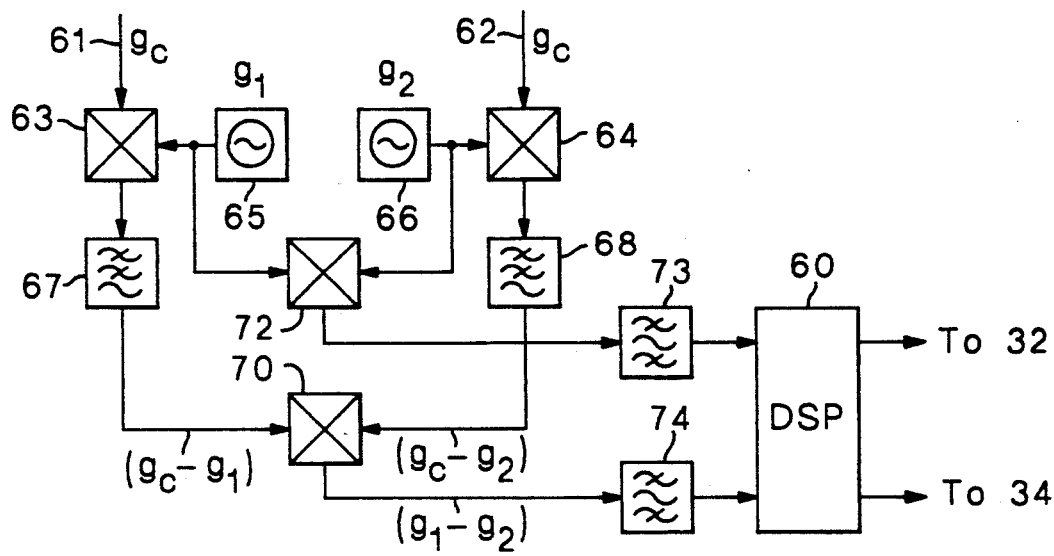
Figure 6:
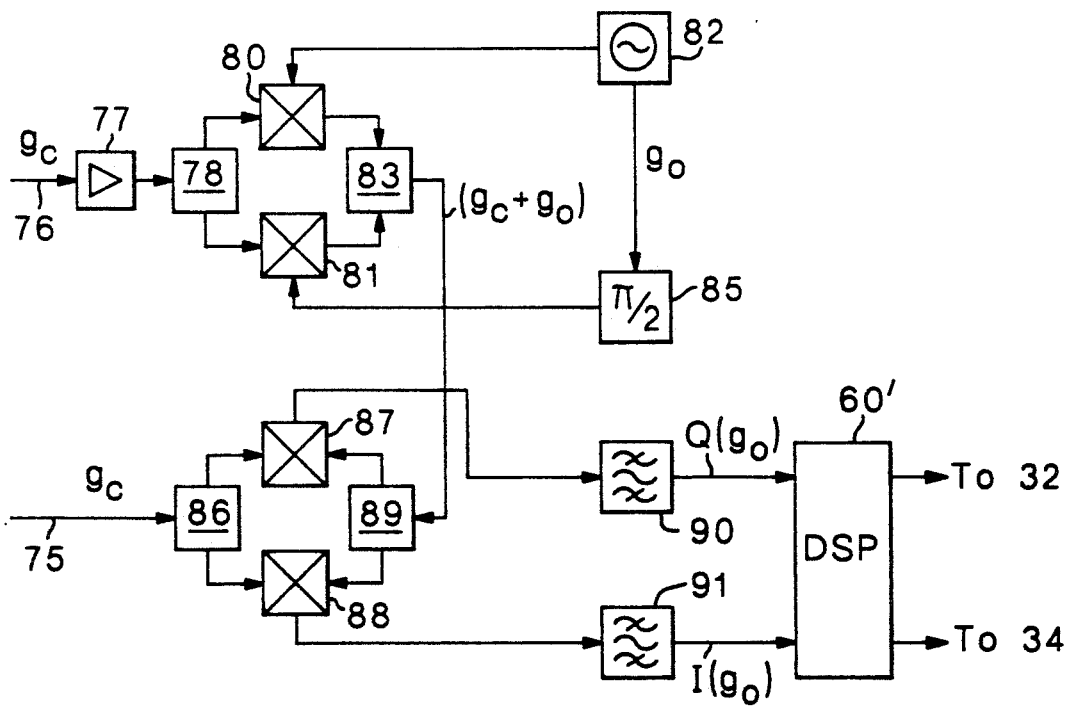
Figure 7:
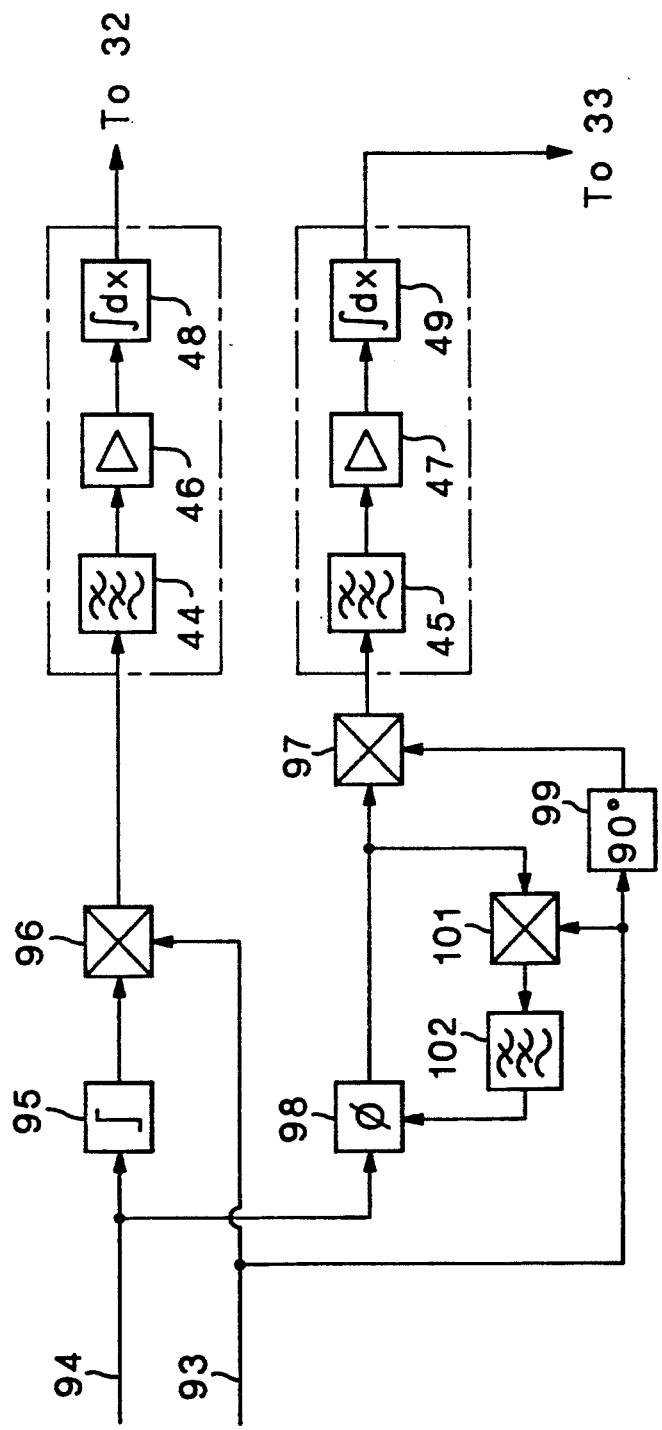

Certain embodiments of the invention will now be described by way of example with reference to the accompanying drawings, in which:

FIG. 1 is a block diagram of an embodiment of the invention showing a feedforward amplifier system with feedback optimisation, FIG. 2 is a block diagram of another embodiment of the invention showing a feedforward amplifier system with feedback real-time parameter adjustment, FIG. 3 shows simplified spectra at various points in FIG. 2 during operation, FIG. 4 is a modified version of the arrangement of FIG. 2, FIGS. 5 and 6 are block diagrams of embodiments using offset frequency techniques and a digital signal processor, and FIG. 7 is a block diagram of an embodiment in which polar coordinate control signals are derived for parameter adjustment.

In FIG. 1 an input signal at a terminal 1 is divided splitter 2 between two paths: a main path 3 to a main amplifier 4, and a subsidiary path 5 to phase and gain adjustment components 6 and 7. The output signal from the main amplifier 4 includes distortion products in the form of intermodulation. A sample of the main amplifier output is obtained by the directional coupler 9 and fed to a combiner 11. The other input to the combiner 11 is arranged to be in anti-phase to the sampled power amplifier output (thus forming a subtracter) by correct selection of a time delay element 8 and correct adjustment of the phase shift component 6. For optimum cancellation of the input signal this is not sufficient, as the amplitude levels must also be equal, and this is arranged by correct adjustment of the variable gain component 7. The signal obtained from the output of the subtractor 11, in theory, contains only the distortion products and forms an error signal.

By similar means to that described above, the error signal is used to cancel the distortion products present in the output of the main amplifier 4. In this case the main amplifier signal, having traversed the 'through' path of the directional coupler 9, is delayed by a time delay element 16 and fed to one input of a directional coupler 17 acting as a subtracter. The other input of the directional coupler 17 is obtained by processing the error signal derived previously from the combiner 11 (acting as a subtracter) using a time delay element 12, phase and gain adjustment components 13 and 14, and an error amplifier 15. The variable gain and phase shift components 13 and 14 are adjusted for maximum cancellation of the unwanted distortion products present in the output signal of the coupler 17 and also allow for phase and amplitude errors in the amplifier 15.

The reference signal in the path 5 is independently adjusted in phase and amplitude by the variable phase shift and variable gain components 6 and 7 in order to compensate for the particular gain and phase anomalies of the power amplifier 4 at the frequency of interest. The gain and phase weighted reference signal is then time delayed to form the input to the adder 11.

Automatic adjustment of the phase shift and gain components 6 and 7 is achieved as follows. A sample of the error signal is obtained by a directional coupler 10 following the subtractor 11 and forms one input to a feedback network 18. A sample of the reference signal is obtained using a directional coupler 19 and forms the second signal feeding the feedback network 18. Suitable processing of these two signals, as described below, yields two control signals for the variable phase and gain components 6 and 7.

The variable phase and gain components 13 and 14 are controlled by a further feedback network 20. The inputs to this control network are from a directional coupler 21 following the time delay element 16 and from a directional coupler 22 following the error amplifier 15. Suitable processing of these two signals yields the necessary control signals for the phase and amplitude adjustment components 13 and 14.

The positions of the directional couplers 10, 19, 21 and 22 may be changed to positions where the same information can be obtained. For example the coupler 19 may be placed after the time delay element 8, and the coupler 22 may be placed before the amplifier 15, the gain adjustment component 14, the phase adjustment component 13 or the time delay element 12.

The techniques described in this specification are applicable to both single and multiple input signal operation. FIG. 1 shows a single channel correction system, with the correction in the error determining loop occurring in the reference signal path. Correction can equally be applied in the main amplifier path, prior to the main amplifier, and multiple corrections may also be applied to overcome frequency dependent characteristics of the amplifier. The invention includes all such configurations.

FIG. 2 shows in more detail another similar preferred embodiment of the invention in which phase and amplitude correction is carried out in the main signal path. Components which have the same function in FIG. 2 as in FIG. 1 have the same designations and the points at which spectra shown in FIGS. 3(a) to (g) appear are indicated by the letters (a) to (g) in FIG. 2.

The input to FIG. 2 is in the form of multiple input signals each in its own channel, which may for example be one of a large number of channels, such as about a hundred cellular telephone channels. Such signals may then be amplified in a single broadband amplifier 4 and applied to a common antenna (not shown). The spectra of three out of n of the input signals are shown in FIGS. 3(a), (b) and (c). The input signals are each split into two paths by splitters 23, one path forming an input to a reference path combiner 26 and the other, after phase and gain adjustment, forming part of the input to the main power amplifier 4. Each of the input signals is independently adjusted in phase and amplitude by groups of variable phase shift and variable gain components 24 and 25 in order to compensate for the particular gain and phase anomalies of the power amplifier 4 at the individual frequencies of each signal. The gain and phase adjusted input signals are then added at a combiner 28 to form the input to the main power amplifier 4. The output spectrum of the amplifier 4 is shown in FIG. 3(d) and includes frequency components below the frequency $f_l$ and above the frequency $f_n$. These components represent the distortion caused in the amplifier 4 and depend on the number of frequencies $f_n$ and their spacing in the frequency spectrum. They are shown in simplified form in FIGS. 3d and 3e by way of illustration, only. Subtraction of the error signal from the amplifier output at the coupler 17 gives the output signal spectrum of the FIG. 3(e).

An error signal is derived from the adder 11 in the same manner as described above for FIG. 1 except that the phase and gain adjustment components 6 and 7 in the reference path are replaced by the groups of components 24 and 25 in the input path to the main amplifier. In addition the control signals for phase and amplitude components are taken from different points. The error signal has the spectrum of FIG. 3(f) with the input signal components at a very low level.

Automatic adjustment of one pair of phase and gain adjustment components 32 and 33 in the groups 24 and 25 is achieved as follows. A sample of the error signal is obtained by the directional coupler 22 and forms one input to each of two quadrature mixers 42 and 43 via a splitter 40 (two such mixers and circuits coupled thereto being required for each input signal, with one pair only being shown in FIG. 2). A sample of the first input signal is obtained using a directional coupler 34 and is fed to the mixer 43 by way of a splitter 35 and to a phase quadrature circuit 41. The output of the circuit 35 provides one input for the mixer 42. Similarly couplers in a group 36 provide signals for the other pairs of mixers, phase quadrature circuits and subsequent circuits.

The network in FIG. 2 is designated 18' to signify that it has the same function as the feedback network 18 of FIG. 1 except that it provides a control signal allowing the phase and amplitude of the frequency of each of the channel input signals to be individually adjusted for correct cancellation in the adder 11 to give an uncontaminated error signal. In FIG. 1, one input signal for the network 18 is the reference signal and the other is the error signal but in FIG. 2 one group of input signals for the network 18' is the main amplifier input signal and the other is the error signal after amplification by the amplifier 15 (and phase and amplitude correction by its associated components 13 and 14). Both networks 18 and 18' thus employ input signals which contain the amplifier input signals (in the main or reference path) and the error signal.

By using the channel input signals to identify the unwanted components of the error signal (that is the frequencies $f_l$ to $f_n$ (FIG. 3(f)) of the channel input signals in FIG. 2) the networks 18 and 18' are able to provide the required control signals. In FIG. 2 the input signals from the group of couplers 36 can be regarded as being used (in the mixer) to select the frequencies of the channel input signals in the error signal from the coupler 22. Two ways in which this is achieved are now described with reference to FIG. 2, firstly by an in-phase (I) and quadrature (Q) technique, and secondly by an energy minimisation technique.

The d.c. component of the output signal of a balanced mixer or of a phase detector, such as a diode ring modulator, passes through zero when the mixer input signals are in quadrature. The magnitude of the d.c. component depends on the amplitudes and relative phase of the input signals and the relative phase determines the sign of the d.c. component. The outputs of the mixers 42 and 43 represent simultaneous independent Q and I signals and their d.c. components (see FIG. 3(g)) are selected by low-pass filters 44 and 45. When both these d.c. components are at zero the input signals $f_l$ to $f_n$ have been eliminated from the error signal.

Since these output signals are part of a servo loop controlling the phase and amplitude adjustment components 32 and 33, the Q and I d.c. components vary in magnitude as adjustments occur. These varying d.c. components are supplied to amplifiers 46 and 47 and when the outputs of these amplifiers are both zero, the phase and amplitude of the error signal is correct for complete cancellation of the channel input signals from the error signal. As the outputs of the amplifiers become positive or negative under varying conditions, the phases and amplitudes of the channel input signals are corrected for complete cancellation using the error signals applied to the adjustment components 32 and 33.

As the outputs of the amplifiers give only the sense (direction) of the control signals required, subsequent integration is necessary using components 48 and 49. These sum the amplifier output signals over time to obtain the correct control voltage levels. The control signals for the phase and gain adjustment components 32 and 33 are then formed by the outputs of the integrators 48 and 49. As shown the integrator 48 is connected to the component 32 and the integrator 49 is connected to the component 33 but depending on phase relationships at the input to the network 18' due to delays in circuits and connections the integrator 48 could be connected to the component 33 and the integrator 49 to the component 32. Selection of these connections may be made empirically or the connections shown in FIG. 2 may be made as shown but manually adjustable delays can be inserted at the input to the network 18' and adjusted to make the circuit function properly.

It can be shown that the control signals from the integrators 48 and 49 are independent of one another in that change in one signal is not accompanied by significant change in the other provided either or both the errors in amplitude and phase of the respective input signal to the combiner 28 are small.

Other phase and gain adjustment components in the groups 24 and 25 are controlled in the same way with respective signals from the group of couplers 36 used as inputs to the other pairs of mixers mentioned above. The splitter 40 supplies the other inputs for those pairs of mixers.

The network 18 of FIG. 1 may use the same technique but in single channel form.

The I and Q signals may be converted to represent amplitude and phase by rectangular to polar coordinate conversion to provide polar signals (that is signals $$\sqrt{I^2 + Q^2} \text{ and } \text{Tan}^{-1}\frac{Q}{I}$$

are derived). The gain and phase adjustment components are then controlled by the "radius" and "angle" polar signals, respectively. Similar techniques may be used in a feedback network 20' and (without the splitter 40) in the feedback network 20. Here the object is to adjust the amplitude of the error signal representative of distortion to be the same in the coupler 17 as in the signal from the amplifier 4 but to be in anti-phase so that subtraction and cancellation occurs. Two inputs from the splitter 40 are
connected to mixers (not shown) in the network 20', one via a quadrature phase shift (not shown). Outputs from integrators (not shown) are passed to phase and amplitude adjustment components 13 and 14. Only one I and one Q signal is derived and only one phase and one amplitude adjustment component is used.

The above mentioned energy minimisation technique is put into practice by two changes to FIG. 2. Firstly the mixers 42 and 43 are of a type in which the d.c. component of its output signal is minimised when its input signals are in quadrature phase, with the sense of change of the output signal being determined by phase. Secondly the amplifier circuits 46 and 47 are replaced by respective differentiators (not shown). Since the mixer outputs are at a minimum when the phase and amplitude components 32 and 33 are correctly adjusted, differentiation is required in order to ascertain the sense of the said change, with integration being required as before providing the respective control signals for the components 32 and 33.

Energy minimisation as described above may also be used for the feedback circuit 20', using the inputs mentioned above, and in a single channel version for the network 20. Other known energy minimisation techniques may also be suitable, for example the use of a diode detector.

The phase adjustment required for broadband signals in the amplifier 4 may be more than 360° across the whole band and therefore the phase adjustment components 6 and 13 and in the group 24 may be formed by a combination of switched delay elements, equivalent to 360° delay or more, and phase delay elements of up to 360° phase change.

Since the object of the feedback network 20' is to ensure the correct amplitude and phase of the error signal, a problem which can arise in the arrangement of FIG. 2 is that the frequencies $f_l$ to $f_n$ in the output signal from the coupler 17 are of such high magnitude in the input from the coupler 21 to the feedback network 20' that the small remaining components at these frequencies are detected instead of distortion components. This results in control signals for the phase and amplitude components 13 and 14 which are proportional to the wanted signals and not the error signal (that is the distortion components). This problem is overcome in a preferred modification of FIG. 2 which is shown in FIG. 4. Here a directional coupler 50 selects the frequencies $f_l$ to $f_n$ from the output of the combiner 26 and applies them by way of a splitter 56, an amplifier 51, a delay circuit 52, a phase adjustment component 53 and an amplitude adjustment component 54 to a combiner 55 arranged to subtract signals derived from the coupler 50 from those derived from the coupler 21. In this way the magnitudes of the frequencies $f_l$ to $f_n$ in the output of the combiner 55 which is applied to the feedback network 20' are reduced so that detection of these signals is substantially absent. A further feedback network 59 which can be of the same form as the feedback network 18' is used to control the phase and amplitude adjustment components 53 and 54. The input signals for this feedback network are taken from the splitter 56, and a coupler 57 by way of a splitter 58, respectively. However a reference signal could, as an alternative, be taken at any point between the combiner 26 and the amplifier 51 or the delay element 8. As another alternative, a separate group of components corresponding to the components 51 to 54 and the feedback network 59 may be provided for each input channel, when a reference signal for the feedback network of each channel is taken between respective ones of the splitters 23 and the couplers 36, the other input being taken from the coupler 57 through splitters corresponding to the splitter 58, one of each for each channel. A further combiner is coupled to the outputs of the groups and the combined outputs are connected to the combiner 55.

The filters 44 and 45, the amplifiers 46 and 47, the integrators 48 and 49 and any differentiators used in the energy minimisation technique may be implemented in the form of a programmed digital signal processor integrated circuit (DSP). The programming of DSPs is described in the book "Digital Signal Processing Design" by Andrew Bateman and Warren Yates, published by Pitman, London, in 1988. Those parts of FIGS. 2 and 4 which show the circuits 44 to 49 can be regarded as equivalent to a flow chart for processing signals from the mixers 42 and 43 since these signals are first filtered, then amplified and then integrated. Programming a DSP to carry out these functions is routine for those skilled in the art. Chapter 4 of the above mentioned book describes how filters can be implemented; amplification is carried out by multiplication as described on pages 18 to 20 and 96 to 97 of the book and integration is a matter of summation and is a well known process in any microprocessor application.

One of the problems which arises in constructing circuits for linearising broadband amplifiers is that these circuits must function accurately in order to remove distortion and problems arise with temperature and ageing. DSPs do not suffer from such problems since they function in a digital manner, and therefore it is advantageous to replace as much as possible of the circuits of FIGS. 1, 2 and 4 with a DSP. However, unwanted d.c. components may arise from imperfections in the mixers and in the A/D converters in the DSP circuits. Such unwanted components can be practically eliminated by arranging for the DSP input signals to be at audio frequency allowing mixing to be performed in software without introducing unwanted d.c. components. Also for real time operation, input frequencies for DSPs should preferably be not much higher than 5 KHz although future advances in DSP technology are likely to enable higher frequencies to be used. With this in mind each of the feedback networks 18, 18', 20, 20' and 56 may be replaced by the circuit of FIG. 5, although a DSP 60 (shown in FIG. 5) may be multiplexed to operate for more than one, or even all, of the networks in one amplifier correction circuit. In addition, the DSP 60 may be multiplexed to operate for several of the networks 18' which correspond to different input channels. In practice it is better to use a number of DSPs, each of which acts as, for example, three of the feedback networks.

The object of the circuit of FIG. 5 is to reduce the frequencies of the input signals to the DSP so that they are below about 1 KHz. Taking the circuit 18' of FIGS. 2 and 4 as an example, the connection from the coupler 34 is shown at 61 and the two inputs from the splitter 40, which are identical and therefore can be conveyed by a single connection, are represented at 62. These signals may be in the bandwidth 860 to 900 MHz and the frequency of a particular channel in this bandwidth is designated $g_c$. Mixers 63 and 64 receive signals from respective oscillators 65 and 66 at frequencies $g_1$ and $g_2$ differing by about 1 KHz. The lower sidebands of the mixers 63 and 64 are selected by filters 67 and 68 so that for a single channel their output frequencies are $(g_c-g_1)$ and $(g_c-g_2)$ If a signal at 61 is regarded as a reference input and that at 62 is regarded as an error signal, then the error is carried forward through the mixer 63 and the filter 67 to a mixer 70 whose output which has the frequency $(g_1-g_2)$ also carries the error signal. A reference signal also at the frequency $(g_1-g_2)$ is obtained by mixing the outputs of the oscillators 65 and 66 in a mixer 72. The two signals at the frequency $(g_1-g_2)$ are selected by filters 73 and 74 and applied to the DSP 60 which may be programmed to carry out the functions of the boxes shown in the network 18'. As mentioned above DSP programming is routine to those familiar with the art and reference has been made to a book by Bateman and Yates. This book also has a section 6.3 on quadrature signal processing and a section 6.5 on modulation techniques covering suitable techniques for the mixers 42 and 43 and the 90° phase shift 41.

However examples of subroutines (a) to (f) for a type TMS 320C 25 which may be used as the DSP 60 are now given. The subroutines are given in assembly language with the first column containing instructions and the second one or two operands separated by commas. The subroutines use the mnemonics given in the manuals for this type of DSP and signals have self-explanatory mnemonics. In subroutine (b) phase shift by 90° in one path has to be accompanies by delay in another path.

| a) Inputting reference and error signals from ADC's | | |
|---|---|---|
| IN | REFSIG,PA0 | *input reference signal |
| IN | ERSIG,PA1 | *input error signal |
| b) Applying 90 degree phase shift to reference signal, using a Hilbert transform filter and delay | | |
| LRLK | AR1,HDEL1 | *point to filter delay start |
| LAC | REFSIG | *load reference input |
| SACL | * | *enter in filter delay line |
| MPYK | 0 | *clear P register |
| PAC | | *clear accumulator |
| LRLK | AR1,HDEL11 | *point to filter delay end |
| RPTK | NHDEL-1 | *set repeat count |
| MACD | HCOF11,*- | *do multiply accumulates |
| APAC | | *accumulate final product |
| SACH | REF90,1 | *save Hilbert filter result |
| LRLK | AR1,HDEL6 | *point into middle of delay |
| LAC | * | *extract signal |
| SACL | REF0 | *save as delayed signal |
| c) Mixing error signal with I,O versions of reference signals | | |
| LT | ERSIG | *get error signal in T reg. |
| MPY | REF0 | *multiply with I reference |
| PAC | | *get product in accumulator |
| SACH | MIX1,1 | *save mixer result |
| MPY | REF90 | *multiply with Q reference |
| PAC | | *get product in accumulator |
| SACH | MIX2,1 | *save mixer result |
| d) Lowpass filtering mixer result | | |
| LRLK | AR1,L1DL1 | *point to filter delay start |
| LAC | MIX1 | *load mixer result |
| SACL | * | *enter in filter delay line |
| MPYK | 0 | *clear P register |
| PAC | | *clear accumulator |
| LRLK | AR1,L1DL21 | *point to filter delay end |
| RPTK | NLPDL-1 | *set repeat count |
| MACD | LC0F21,*- | *do multiply accumulates |
| APAC | | *accumulate final product |
| SACH | L1RES,1 | *save lowpass result |
| e) Scaling lowpass filter result, and integrating | | |

| -continued | | |
|---|---|---|
| LT | K | *integrator constant in T |
| MPY | L1RES | *scale lowpass result |
| PAC | | *get product in accumulator |
| ADDH | INT1 | *add in integrator contents |
| SACH | INT1 | *save new result |
| SACH | CNTRL1 | *save as control output |
| f) Outputting control voltages to DAC's | | |
| OUT | CNTRL1,PA0 | *output to DAC 1 |
| OUT | CNTRL2,PA1 | *output to DAC 2. |

Since FIG. 5 offsets the operating frequencies from the bandwidth of the amplifier 4 to a bandwidth suitable for operation by a DSP, the technique is known as offset-frequency digital control. Incidentally, the frequencies $(g_c-g_1)$, $(g_c-g_2)$ and $(g_1-g_2)$ are intermediate frequencies which can be selected over a very wide range to suit available mixers and low pass filters. A typical range is between 100 and 800 MHz for an amplifier operating at 900 MHz.

An alternative offset digital controller is shown in FIG. 6 where, for the example of the network 18', signals from the coupler 34 appear at a connection 75 and signals from the splitter 40 appear at a connection 76. After passing through an amplifier 77 the signal at the connection 76 which may be regarded as an error signal, is applied to a circuit 78 whose outputs are shifted in phase by 90° in relation to one another. These outputs are applied to mixers 80 and 81 which receive respective quadrature signals from an offset generator 82. Thus two signals separated by 90° at the frequency $g_c+g_0$ appear at the output of a combining circuit 83, where $g_0$ is the frequency of the oscillator 82 and is suitable for DSP processing at about 1 KHz. A phase shift circuit 85 provides the necessary difference in phase for signals applied from the oscillator 82 to the circuits 80 and 81.

The signal at the connection 75 which may be regarded as a reference signal is applied to a circuit 86 with two outputs separated in phase by 90° which are applied respectively to mixers 87 and 88 which also receive signals from a splitter circuit 89 connected to the output of the combining circuit 83. As a result the outputs of the mixers 87 and 88 are both at the frequency $g_0$ but are separated in phase by 90°. These signals are selected by filters 90 and 91 and form I and Q signals for a DSP 60' which is the same as the DSP 60 except that there are no processing steps equivalent to the components 35, 41, 42 and 43 shown in the network 18'.

In another embodiment of the invention, phase and amplitude control signals may be provided directly by means of the circuit shown in FIG. 7 which can therefore be used for any or all of the feedback networks of FIGS. 1, 2 and 4. Again taking the circuit 18' as an example, the signal from the coupler 34 appears on a connection 93 and may be regarded as a reference signal and the signal from the splitter 40 appears on a connection 94 and may be regarded as an error signal. The connection 94 is connected by way of an amplitude limiter 95 to a mixer 96 which acts as a phase detector and has its other input coupled to the connection 93. Thus a phase error signal appears at the output of the detector 96 and is, in this example, connected to the phase adjustment component 32. In order to obtain an amplitude error signal a coherent detector 97 is used which must receive in phase signals. This is achieved by connecting a variable phase shift circuit 98 between the connection 94 and the detector 97 and automatically controlling the phase shift of the circuit 98 using an arrangement which locks its output in quadrature with the reference signal on the connection 93, and then the necessary in-phase relationship for the coherent detector is provided by a 90° phase shift circuit 99. Control for the phase shift circuit 99 is derived from a phase detector 101 which receives signals from the output of the phase shift circuit 98 and the connection 93. Low frequencies from the detector 101 are selected by a filter 102 and applied as a control signal to the variable phase shift circuit 98. Thus if the output of the circuit 98 and signals on the connection 93 are not in phase quadrature, the phase shift applied by the circuit 98 is adjusted until phase quadrature is achieved. The output signal of the detector 97 is proportional to amplitude error and is connected, in this example, to control the amplitude adjustment component 33. As an alternative the loop filter 102 may be replaced by an amplifier in parallel with an integration circuit providing a proportional plus integral controller for the variable phase shift circuit 98.

Phase adjustment components shown throughout the figures may be constructed using a quadrature hybrid circuit with two ports connected to varicap diodes (that is diodes whose capacitance varies with applied bias). In this context a quadrature hybrid circuit can be regarded as having a first port at which an input signal is applied, respective second and third ports to which the varicap diodes are connected and a fourth port providing the output for the circuit. Signals at the second and third ports are in quadrature phase and variation of capacitance terminating these ports provides phase shift between the first and fourth ports. The amplitude adjustment components mentioned throughout this specification may also be constructed using a quadrature hybrid circuit but in this case the varicap diodes are replaced by PIN diodes. In both cases the control signals are applied as bias signals for the varicap or PIN diodes, as appropriate.

It will be appreciated that the invention can be put into practice in many other ways than those specifically described.

Broadband amplification can be achieved using a single input and single or multiple error determining loops, the latter deriving separate input signals for the network 18 or equivalent using low-pass filters.

A further implementation could be described as a feedforward "transmitter" in which individual input signals are at baseband (audio frequency). These signals are then converted to radio frequency before amplification. In such a transmitter the points from which signals are taken for at least some of the feedback networks in order to derive control signals for amplitude and phase control may vary from those shown in the Figures. Some may be derived from the audio input signals.

We claim:

1. Apparatus for reducing distortion produced by an amplifier, comprising
    error-signal generating means for connection to an input and output of an amplifier for deriving an error signal dependent on the output of the amplifier and input signals supplied to the amplifier from which it is required to provide undistorted output signals,
    correction means for cancelling the distortion in the amplifier output signals by using the error signal,
    the error-signal generating means comprising adjustment means for automatically adjusting amplitude and phase of the error signal in response to at least one control signal to give improved cancellation of the said distortion,
    means for abstracting portions of the input signals and the error signal,
    offset means for reducing the frequencies of the signals so abstracted to an intermediate frequency, and
    control means for operating on the signals at the intermediate frequency to generate the control signals at a frequency below the intermediate frequency.

2. Apparatus according to claim 1 wherein the offset means comprises
    first and second signal generators having output frequencies whose difference in frequency equals the required intermediate frequency,
    first and second mixers coupled to receive the outputs of the first and second signal generators, respectively, and respective ones of the said abstracted portions,
    means for selecting the lower sidebands of the output signals of the first and second mixers,
    a third mixer coupled to receive the output signals of the signal generators,
    a fourth mixer coupled to receive the said lower sidebands, and
    means for selecting the lower sidebands of the output signals of the third and fourth mixers as the intermediate frequency signals.

3. Apparatus according to claim 2 wherein the control means includes a digital processing integrated circuit connected to receive the intermediate frequency signals as input signals.

4. Apparatus according to claim 1 wherein the offset means includes
    a signal generator having an output frequency at the required output frequency of the reduced frequency signals, and two outputs in phase-quadrature with one another,
    first and second pairs of mixers, each pair having an input terminal connected to apply signals in quadrature to the respective mixers of the pair, and being connected to receive respective ones of the said abstracted portions,
    the mixers of the first pair being connected to receive respective outputs of the signal generator and having an output terminal connected to combine the output signals of the mixers,
    the mixers of the second pair being connected to receive the combined output signals of the first pair and having separate output terminals, and
    means for selecting the lower sidebands of the mixers of the second pair as the intermediate frequency signals.

5. Apparatus for reducing distortion produced by an amplifier, comprising:
    error-signal generating means for connection to an input and an output of an amplifier for deriving an error signal dependent on the output of the amplifier and input signals supplied to the amplifier from which it is required to provide undistorted output signals,
    correction means for cancelling the distortion in the amplifier output signals by using the error signal,
    the error-signal generating means comprising independently acting first and second adjustment means for carrying out automatic, respective, adjustment of amplitude and phase of at least one of: the error signal and a signal used in generating the error signal, the automatic adjustment being carried out in response to respective first and second simultaneously derived control signals to give improved cancellation of said distortion, control means for generating the first and second control signals, comprising processing means for processing first and second control-means input signals to provide the first and second control signals, first abstraction means for abstracting the first control-means input signals from a place in the apparatus where a signal representative of the input signal occurs, and second abstraction means for abstracting the second control-means input signals from a place in the apparatus where a signal representative of the error signal occurs, and offset means for reducing the frequencies of the control-means input signals after abstraction and supplying the reduced frequency control-means input signals to the processing means.

6. Apparatus according to claim 5 wherein the processing means comprise polar-coordinate means for providing amplitude control and phase control signals as the first and second control signals, respectively.

7. Apparatus according to claim 5 wherein the error-signal generating means is such that the first and second control signals are substantially independent of one another at least when the said distortion is near cancellation.

8. Apparatus according to claim 5 wherein the error-signal generating means comprises subtraction means for subtracting the input signals from signals representative of the output signals of the amplifier, in generating the error signal, and wherein the first and second adjustment means include means for adjusting the phase and amplitude in response to the said control signals so that the error signal contains substantially only the said distortion.

9. Apparatus according to claim 8 comprising independently acting third and fourth adjustment means for automatically adjusting the phase and amplitude, respectively of the error signal in response to respective third and fourth simultaneous independent control signals to values where the correction means carries out substantially optimum cancellation of the said distortion.

10. Apparatus according to claim 9 wherein the control means comprises means for processing third and fourth control-means input signals to provide the third and fourth control signals, third means for abstracting the third control-means input signals from a place in the apparatus where a signal representative of the correction means output signal occurs, and fourth means for abstracting the fourth control-means input signals from a place in the apparatus where a signal representative of the error signal occurs.

11. Apparatus according to claim 5 further comprising a plurality of input signal channels, means for providing signals in the channels to provide input signals to the amplifier, wherein the first and second adjustment means comprise a plurality of phase and amplitude adjustment elements, one pair of said elements in each said input channel.

12. Apparatus according to claim 11, wherein the processing means includes a plurality of sub-units, one associated with each input signal channel and for providing one of the first and one of the second control signals to the adjustment elements of the associated channel, the said first abstraction means comprises means for abstracting a signal from each input signal channel to provide first control-means input signals, one for each sub-unit, the said second abstraction means includes means for abstracting the error signal at an input to the correction means, and means for splitting the abstracted error signal into a plurality of second control-means input signals, one for each said sub-unit.

13. Apparatus according to claim 12 further comprising independently acting third and fourth adjustment means for automatically adjusting the phase and amplitude, respectively, of the error signal in response to respective third and fourth simultaneous independent control signals whereby the correction means carries out substantially optimum cancellation of the said distortion, wherein the control means comprises means for processing the second control-means input signals and third control-means input signals to provide the third and fourth control signals, and third means for abstracting the third control-means input signals from a place in the apparatus where a signal representative of the error correction means output signal occurs.

14. Apparatus according to claim 12 wherein at least one sub-unit of the processing means include means for deriving in-phase and quadrature signals from the control-means input signals and for providing control signals which are representative of polarity and magnitude of the relative phases and amplitudes of the control-means input signals.

15. Apparatus according to claim 12 wherein at least one of the sub-units of the processing means comprises first and second mixers and phase quadrature shift means connected at one input of the second mixer, the first mixer and the shift means being connected to receive the first and second control-means input signals, respectively, and first and second groups, each comprising a low pass filter, an amplifier and integration means connected in series, inputs of the first and second groups being connected to the outputs of the first and second mixers, respectively, and outputs of the first and second groups each providing one of the control signals.

16. Apparatus according to claim 12 wherein at least one of the sub-units of the processing means comprise polar-coordinate means for providing amplitude control and phase control signals as the first and second control signals, respectively.

17. Apparatus according to claim 5 wherein the processing means are constructed to derive in-phase and quadrature signals from the control-means input signals and to provide control signals which are representative by polarity and magnitude of the relative phases and amplitudes of the control means input signals.

18. Apparatus according to claim 5 wherein the processing means comprises first and second mixers and phase quadrature shift means connected at one input of the second mixer, the first mixer and the shift means being connected to receive the first and second control-means input signals, respectively, and first and second groups, each comprising a low pass filter, an amplifier and integration means connected in series, inputs of the first and second groups being connected to the outputs of the first and second mixers, respectively, and outputs of the first and second groups each providing one of the control signals.

19. Apparatus according to claim 5 wherein the offset means comprises first and second signal generators having output frequencies whose difference in frequency equals the required reduced frequency of the control-means input signals, first and second mixers coupled to receive the outputs of the first and second signal generators, respectively, and respective ones of the control-means input signals for that processing means, means for selecting the lower sidebands of the output signals of the first and second mixers, third mixer coupled to receive the output signals of the signal generators, a fourth mixer coupled to receive the said lower sidebands, and means for selecting the lower sidebands of the output signals of the third and fourth mixers as the reduced frequency control-means input signals.

20. Apparatus according to claim 5 wherein the offset means includes a signal generator having an output frequency at the required reduced frequency of the control means input signals, and two outputs in phase-quadrature with one another, first and second pairs of mixers, each pair having an input terminal connected to apply signals in quadrature to the respective mixers of the pair, and being connected to receive the control-means input signals for that processing means, respectively, the mixers of the first pair being connected to receive respective outputs of the signal generator and having an output terminal connected to combine the output signals of the mixers, the mixers of the second pair being connected to receive the combined output signals of the first pair and having separate output terminals, and means for selecting the lower sidebands of the mixers of the second pair as the reduced frequency control-means input signals.

21. Apparatus to claim 5 wherein the reduced frequency control-means input signals are, in operation, passed to a digital signal processing integrated circuit forming part of the processing means.

22. Apparatus according to claim 5 wherein the processing means comprise polar-coordinate means for providing amplitude control and phase control signals as the first and second control signals, respectively.

23. Apparatus according to claim 22 wherein the polar-coordinate means comprise phase-adjustment means for so adjusting the phase of the control-means input signals that they are in phase quadrature, a coherent-detector, coupled to receive the output signals of the phase-adjustment of the phase-adjustment means, for generating the first control signals, an amplitude limiter coupled to receive one of the control-means input signals for the processor, and a phase detector for generating the second control signals, coupled to receive the output of the amplitude limiter and, as a reference input, the other of the control-means input signals.

24. A method of reducing the distortion produced by an amplifier comprising the steps of:

deriving an error signal dependent on output signals of the amplifier and input signals supplied to the amplifier from which it is required to provide undistorted output signals, cancelling the distortion produced by the amplifier using the error signal, automatically adjusting, independently, amplitude and phase of at least one of: the error signal and a signal used in generating the error signal, in response to respective simultaneously derived first and second control signals to give substantially improved cancellation of said distortion, generating the first and second control signals in dependence upon first and second control input signals, respectively, abstracting the first control input signals from the input signals, abstracting second control input signals representative of the error signal, and reducing the frequency of the control input signals before generating the control signals from the reduced frequency signals.

25. A method according to claim 24 wherein deriving the error signal includes subtracting the input signals from a signal representative of the output signals of the amplifier, and automatically adjusting, independently, the said amplitude and phase includes adjustment of the phase and amplitude of the input signals used in deriving the error signal such that the error signal contains substantially only the said distortion.

26. A method according to claim 25 comprising the further steps of:

adjusting the phase and amplitude of the error signal to effect optimum cancellation of said distortion using the error signal, deriving third and fourth control signals in dependence on said error signal and amplifier output signal, and using the third and fourth control signals to adjust the phase and amplitude of the error signal.

* * * * *